United States Patent [19]

Inou et al.

[11] Patent Number: 4,931,918
[45] Date of Patent: Jun. 5, 1990

[54] RINGING CHOKE CONVERTER

[75] Inventors: Kiyoharu Inou; Yoshiaki Koide; Yasunobu Iwata, all of Tokyo, Japan

[73] Assignee: Yokogawa Electric Corporation, Tokyo, Japan

[21] Appl. No.: 377,517

[22] Filed: Jul. 10, 1989

[30] Foreign Application Priority Data

Jul. 29, 1988 [JP] Japan ................... 63-189861
Jul. 29, 1988 [JP] Japan ................... 63-189862

[51] Int. Cl.⁵ .......................................... H02M 3/335
[52] U.S. Cl. ........................................ 363/19; 363/82; 363/91
[58] Field of Search .............. 363/19, 20, 75, 82, 363/90, 91, 97, 131

[56] References Cited
U.S. PATENT DOCUMENTS 4,343,034 8/1982 Wells et al. .......................... 363/82
4,378,585 3/1983 Bete ........................................ 363/19
4,626,976 12/1986 Abe et al. ............................... 363/75

FOREIGN PATENT DOCUMENTS

0121960 6/1985 Japan ..................................... 363/19

Primary Examiner—Peter S. Wong
Attorney, Agent, or Firm—Moonray Kojima

[57] ABSTRACT

A ringing choke converter power supply device comprising a ringing choke converter power supply for stabilizing an output voltage by an indirect feedback system; a variable impedance element provided on a primary or secondary side of the power supply; and a control circuit for transmitting a control signal to the variable impedance element in such a direction that an error signal obtained by comparing the output voltage of the power supply with a predetermined reference voltage becomes zero. The variable impedance element, which is preferably a saturable reactor, is interposed between a voltage detection winding and a feedback diode or between the feedback diode and a capacitor when the element is provided on the primary side; and is interposed between a transformer secondary winding and a rectifier circuit, when the element is provided on the secondary side.

6 Claims, 8 Drawing Sheets

RINGING CHOKE CONVERTER

BACKGROUND OF THE INVENTION

1. Field of the Invention.

This invention relates to a ringing choke converter power supply device (herein abbreviated "RCC power supply") which is classified as a DC-DC converter; and more particularly, to an improvement therein for stabilizing the output voltage thereof.

2. Description of the Prior Art.

Figure 1:
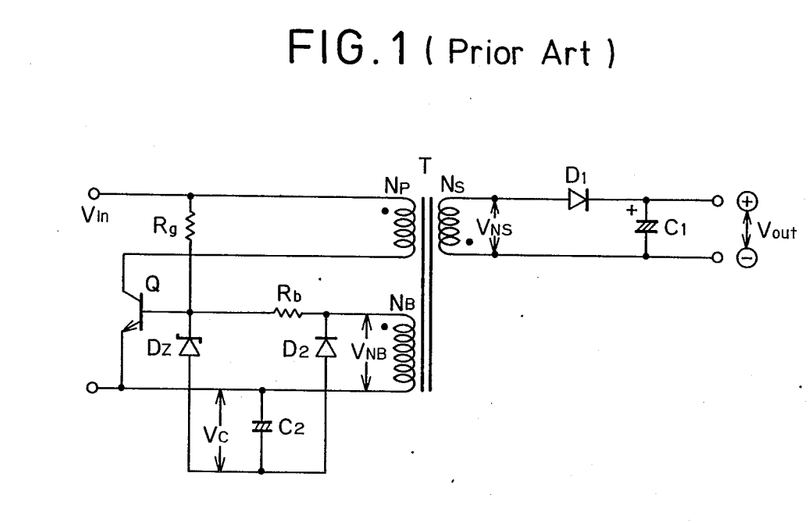
FIG. 1 is a block diagram depicting a prior art device.

Known RCC power supplies are disclosed, for example, in Japanese UM Kokai 62-98490 and 62-111788. FIG. 1 is a block diagram depicting a prior art RCC power supply, wherein an NPN transistor is used as a switching element. In this case, an input terminal corresponds to a collector terminal, an output terminal corresponds to an emitter terminal, and a control terminal corresponds to a base terminal. In other types of switching elements, for example, a PNP transistor, the input terminal corresponds to the emitter terminal, the output terminal corresponds to the collector terminal, and the control terminal corresponds to the base terminal. The situation is the same for an FET.

In FIG. 1, a transformer T includes a primary winding $N_p$, a voltage detection winding $N_B$, and a secondary winding $N_s$ which are all marked with (*) to indicate the anode thereof. In a main transistor Q, which is used for switching, a cathode of primary winding $N_p$ is connected to the collector terminal, while the control input terminal is connected to the base terminal. A starting resistance $R_g$ is interposed between an anode terminal of primary winding $N_p$ and the base terminal of main transistor Q.

A feedback diode D2 and a Zener diode Dz serve as an indirect feedback path to provide a constant voltage circuit. A connective state will now be described. The anode terminal of voltage detection winding $N_B$ is connected to feedback diode D2 to which Zener diode Dz is connected in series. A cathode of feedback diode D2 is connected via a current limit resistance Rb to the base terminal of main transistor Q and also to an anode of voltage detection winding $N_B$. The cathode of Zener diode Dz is connected to the base terminal of main transistor Q. A capacitor C1 has one end connected to a connecting point between feedback diode D2 and Zener diode Dz; and the other end connected to a voltage reference line. Zener diode Dz acts as a constant voltage. power supply and also behaves as an error signal generation circuit of an output voltage with respect to a reference voltage.

It is to be noted that the indirect feedback implies not a step of directly feeding back secondary outputs to stabilize the secondary output voltage, but, is instead, a step of indirectly feeding back the secondary output by using voltage detection winding $N_B$. The indirect feedback is easier to accommodate primary and secondary insulations as compared to the direct feedback. Indirect feedback exhibits characteristics in which the construction is simple and provided at low cost. The secondary winding $N_s$ is rectification smoothed through diode D1 and capacitor C1, and is supplied in the form of an output voltage Vout to a load.

The description will next deal with the thus constructed device. Upon impression of an input voltage Vin, main transistor Q is fed with a base current via starting resistance $R_g$, and is then brought into a switching operation mode. When main transistor Q is turned OFF, a rectifier diode D1 on the secondary side becomes conductive, and at the same moment feedback diode D2 connected to voltage detection winding $N_B$ becomes conductive. At this time, an output voltage Vns of secondary winding $N_s$ is substantially equalized to an output voltage Vout. On the other hand, a voltage Vnb of voltage detection winding $N_B$ is proportional to voltage Vns. Hence, a voltage Vc of capacitor C1 in which voltage Vnb is rectified, is eventually proportional to voltage Vout.

Voltage Vc rises with an increase in output voltage Vout. However, Zener diode Dz becomes conductive to cut the base current of main transistor Q, thereby speeding up the turning OFF of main transistor Q. The output voltage Vout is thus made constant.

There are various deficiencies and disadvantages in the prior art devices. For example, strictly speaking, voltage Vnb is not proportional to voltage Vns due to influence of leakage inductance. Also, no correction is made for drop in voltage which is associated with a DC resistance component of the output circuit and the forward electric potential $V_F$ of the rectifier diode For these reasons, the indirect feedback system is inferior to the direct feedback system in terms of stability of output voltage. In the direct feedback system, an error signal is detected by comparing the output voltage Vout with a direct reference voltage Vref, and control is effected so that the error signal becomes zero.

SUMMARY OF THE INVENTION

It is an object of the invention to overcome the aforementioned and other deficiencies and disadvantages of the prior art.

A further object is to provide a ringing choke converter power supply device of an indirect feedback type which is arranged to stabilize the output voltage approximately to a level of a direct feedback system.

The foregoing and other objects are attained by the invention which encompasses a ringing converter power supply device wherein the output voltage is stabilized by an indirect feedback system. The device comprises a variable impedance element provided on a primary or secondary side of the ringing choke converter power supply; and a control circuit for transmitting a control signal to the variable impedance element in such a direction that an error signal obtained by making a comparison between an output voltage of the ringing choke converter power supply and a predetermined reference voltage becomes zero.

The power supply comprises a transformer in which a DC input voltage is impressed on an anode of a primary winding; a switching element having an input terminal to which a cathode of the primary winding of the transformer is connected and an output terminal to which a reference voltage line on the input side is connected; a secondary circuit for outputting a DC voltage by rectification smoothing a switching signal generated in a secondary winding of the transformer; a voltage detection winding provided in the transformer; a current limit resistance interposed between the voltage detection winding and a control terminal of the switching element; a feedback diode having a cathode and connected to a connecting point between the voltage detection winding and the current limit resistance; a Zener diode having a cathode end connected to a connecting point between the current limit resistance and the control terminal of the switching element; and a capacitor for connecting the reference voltage line to the connecting point between the feedback diode and the Zener diode.

Preferably, the variable impedance element is a saturable reactor. When being provided on the primary side, the variable impedance element is interposed between the voltage detection winding of the ringing choke converter power supply and the feedback diode or, alternatively, between the feedback diode and the capacitor. When being provided on the secondary side, the variable impedance element is interposed between the transformer secondary winding of the ringing choke converter power supply and a rectifier circuit.

The ringing choke converter power supply acts to roughly stabilize the output voltage on the basis of an indirect feedback system. In the stabilization using the variable impedance element, the output voltage is stabilized more exactly, As a result, the invention is provided at low cost and has the same or better stability of a direct feedback system.

DETAILED DESCRIPTION OF THE PREFERRED EMBODIMENTS

Figure 2:
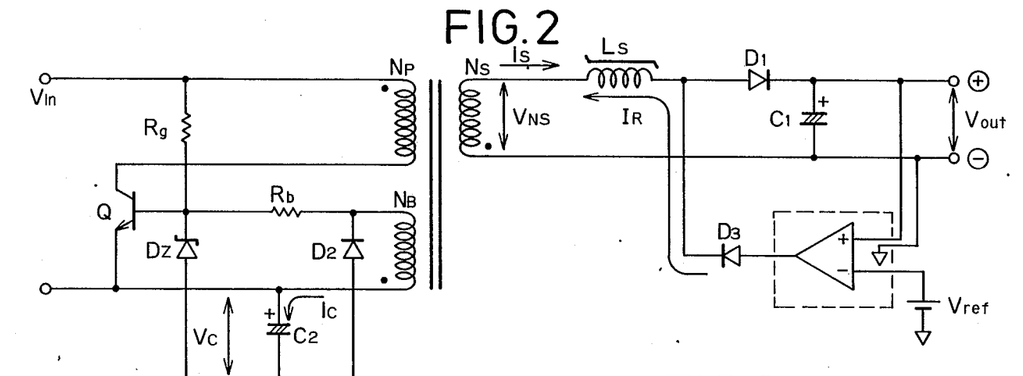
FIG. 2 is a block diagram depicting an illustrative embodiment of the invention.

In FIG. 2, the same components performing the same functions as in FIG. 1 are marked with the same reference symbols and will not be discussed hereat for sake of clarity The embodiment comprises a variable impedance element $L_S$, which may be for example, a saturable reactor, interposed between a secondary winding $N_S$ and an anode of a diode D1, that is on the secondary side of the RCC power supply. According to the desired characteristics of the variable impedance element $L_S$, it is required that the variable impedance element $L_S$ be capable of readily varying an AC impedance and reducing a steady loss.

An error amplifier circuit (not marked) is provided comprising an error detecting unit for obtaining an error signal by comparing an output voltage Vout and a predetermined reference voltage Vref; and an amplifying unit for amplifying the error signal sufficiently to drive the variable impedance element. The reference voltage power supply uses, for example, a Zener diode.

A diode D3 has a cathode thereof connected to a connecting point between the variable impedance element $L_S$ and a diode D1, and an anode thereof connected to an output terminal of the error amplifier circuit. Diode D3 functions to prevent a reset current from returning to the error amplifier circuit. In a saturable reactor, the reset current implies a current flowing into the saturable reactor, and the impedance between the secondary winding $N_S$ and the diode D1 changes depending on the amount of the reset current.

Figure 3:
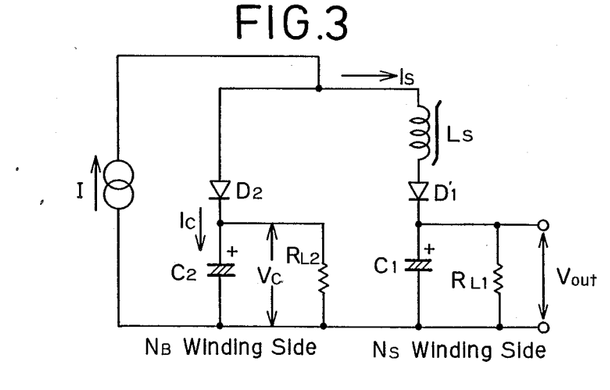
FIG. 3 is a diagram depicting an equivalent circuit when a switching element is in the OFF state.
Figure 4A:
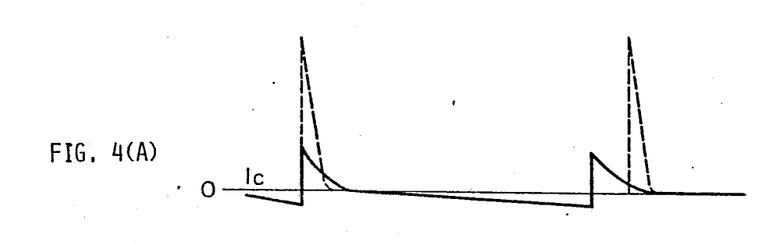
FIG. 4, comprising lines (A)-(D), is a diagram depicting waveforms relative to the device of FIG. 2.
Figure 4B:
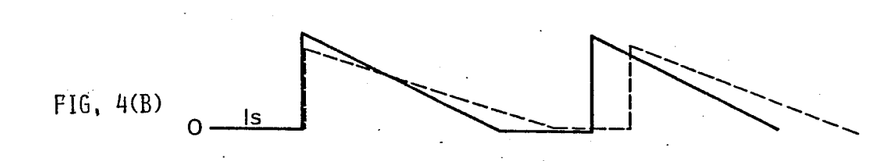
Figure 4C:
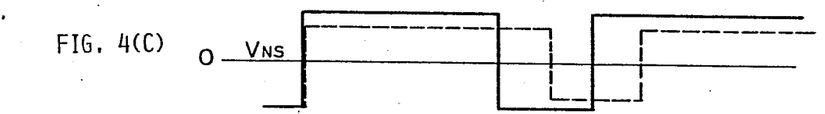
Figure 4D:
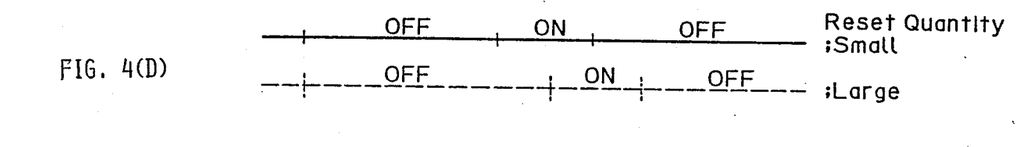

Operation of the embodiment is as follows with reference to FIG. 3 which is an equivalent circuit of the switching element in the OFF state. A ringing choke converter power supply operates to accumulate energy in a transformer while switching element Q is turned ON, but operates to discharge the energy both in the secondary winding $N_S$ and in the voltage detection winding $N_B$, when element Q is turned OFF. These steps are then repeated.

FIG. 4 depicts waveforms associated with the FIG. 2 embodiment, wherein line (A) shows a current $i_c$ flowing in a capacitor C2; line (B) shows a current $i_s$ flowing from the secondary winding to the saturable reactor; line (C) shows a voltage Vns generated in the secondary winding; and line (D) explains the ON/OFF states of switching element Q, wherein the solid line represents the state when the reset quantity is small and the broken line represents the state when the reset quantity is large.

When saturable reactor $L_S$ is connected in series with secondary winding $N_S$, the amount of reset current $I_R$ flowing into saturable reactor $L_S$ is varied, and the waveform of the current $i_c$ flowing in capacitor C2 is thereby changed. The error amplifier increases the reset quantity when the output voltage Vout is high, but reduces the reset quantity when the voltage Vout is low.

When the reset quantity is large, as indicated by the broken line of line (D), the impedance of secondary winding $N_S$ appears to be large instantaneously when turning OFF switching element Q. For this reason, the current flowing in the voltage detection winding $N_B$ is augmented. This results in an increment in peak value of current $i_c$.

Let $R_{L2}$ be the load of capacitor C2, and let T be a cycle. Then, voltage VC is given by the following equation.

$$V_C = \int^T i_c dt \, R_{L2}/T \tag{1}$$

The RCC power supply makes the voltage constant, and hence, control is effected to increase cycle T when the peak value of current $i_c$ becomes large. As a result, the OFF period of the switching element Q is extended, thereby reducing the inclination of secondary current $i_s$.

Supposing that the inductance of secondary winding $N_S$ is expressed by Lns, then voltage Vns is given by $$Vns = Lns \cdot (di_s/dt) \tag{2}$$

Then, the peak value of voltage Vns decreases. As a result, output voltage Vout obtained by the peak rectifying of the voltage Vns, drops.

As discussed, when the output voltage rises, the reset quantity of the saturable reactor increases due to the error amplifier circuit so that the feedback is effected in such a direction as to reduce the output voltage. On the other hand, if the output voltage Vout decreases, the reset quantity is reduced, and the feedback is effected in such a direction as to increase the output voltage Vout, thus stabilizing the output voltage Vout.

Figure 5:
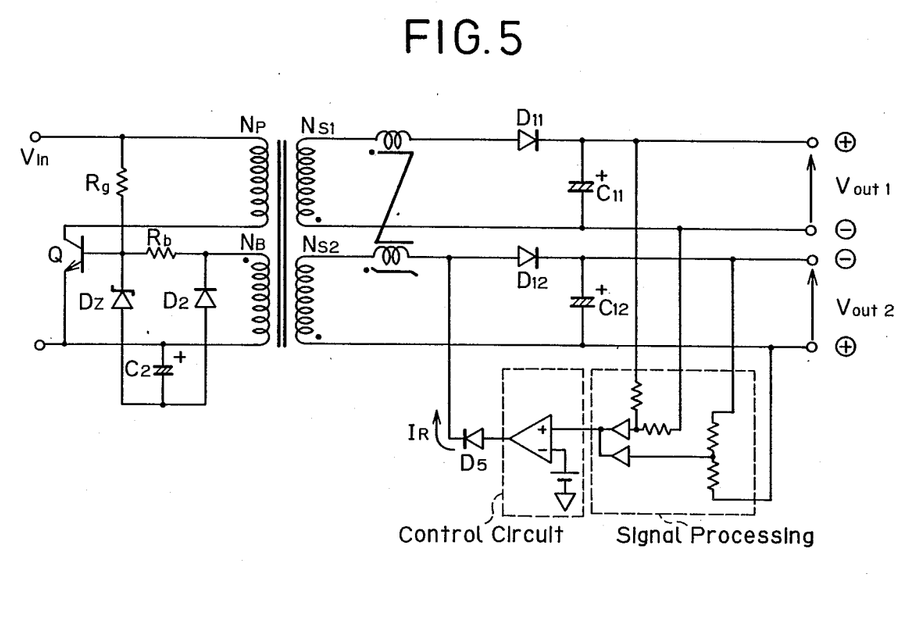
FIG. 5 is a block diagram depicting a second illustrative embodiment of the invention.

FIG. 5 depicts application to a multi-output ringing choke converter power supply, wherein secondary windings $N_{S1}$ and $N_{S2}$, which serve to output voltages Vout1 and Vout2, are connected to respective circuits comprising rectifier diode D11 and capacitor C11, and diode D12 and capacitor C12. The saturable reactor having the same core wound with two windings is incorporated into the secondary circuit. The error amplifier circuit transmits a control signal to the saturable reactor. The saturable reactor controls a plurality of outputs by a single control signal in terms of structure. In this case, the control target may include the following modes. (1) Stabilizing mainly of the output voltage Vout1. (2) Stabilizing mainly of the output voltage Vout2. (3) Stabilizing of the larger of the output voltages Vout1 and Vout2. (4) Stabilizing of the smaller of the output voltages Vout1 and Vout2.

A signal processing circuit is provided, and an arithmetic operation is effected with respect to the output voltages. The results are outputted to the control circuit In above mode (3), for example, the signal levels of the output voltages Vout1 and Vout2 are unified by using a resistance. Subsequently, the signal having a greater magnitude is selected by a diode, and is compared with a reference voltage Vref by means of a comparator, thus obtaining an error signal. The error signal is amplified and then transmitted as a reset current to the saturable reactor. In this manner, the multiple outputs are also stabilized.

Figure 6:
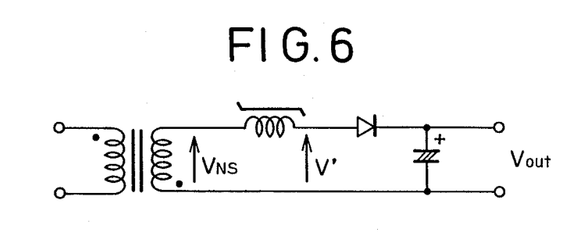
FIG. 6 is a block diagram for explaining operation of a saturable reactor used as a surge absorber.
Figure 7:
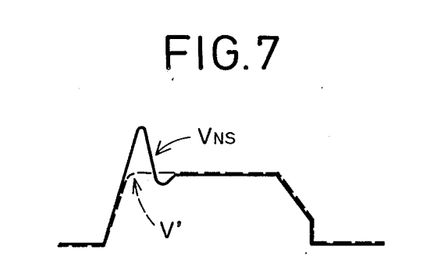
FIG. 7 is a waveform diagram for explaining operation of the FIG. 6 embodiment.

FIGS. 6 and 7 show the effects of the invention when using the saturable reactor as a variable impedance element. The saturable reactor serves as a surge absorber so that the rectifier diode can be protected from excessive surge voltage. More specifically, as indicated by the solid line of FIG. 7, even if a peak waveform is present in the output voltage Vns of the secondary winding $N_S$, the saturable reactor acts to eliminate the peak component, thereby providing a flat waveform drawn with the broken line in FIG. 7.

Figure 8:
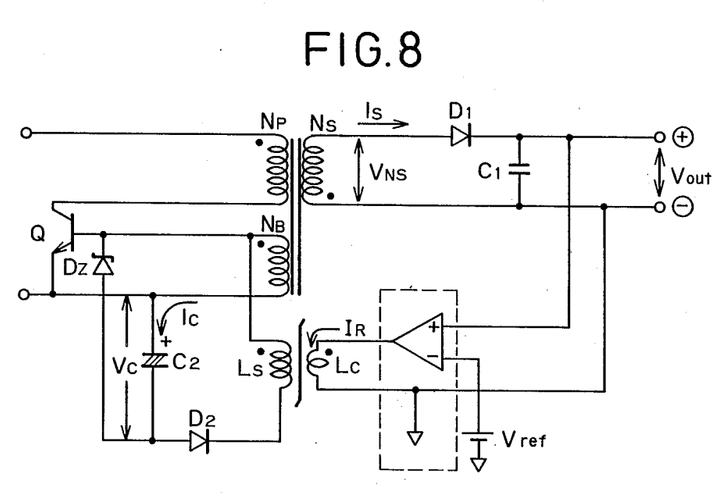
FIG. 8 is a block diagram depicting a third illustrative embodiment of the invention.

FIG. 8 depicts an embodiment wherein the saturable impedance element is disposed on the primary side of the RCC power supply. Variable impedance element $L_S$, which may be for example a saturable reactor, is interposed between voltage detection winding $N_B$ and a cathode of diode D2. The saturable reactor may be connected to the connecting point between an anode of the feedback diode D2 and capacitor C2. According to desirable characteristics of variable impedance element $L_S$, it is required that an AC impedance be easily changed, and the steady loss be small.

An error amplifier circuit (not marked) comprises an error detecting unit for obtaining an error signal by comparing the output voltage Vout with the predetermined reference voltage Vref: and an amplifying unit for amplifying sufficiently the error signal to drive the variable impedance element.

The reference power supply comprises a Zener diode. A control winding $L_C$ wound on the same core as that of the saturable reactor $L_S$ is connected to an output terminal of the error amplifier circuit. Control winding $L_C$ is supplied with a reset current. The reset current in the saturable reactor is the control current, and the impedance of the voltage detection winding $N_B$ varies depending on the amount of the reset current.

Figure 9:
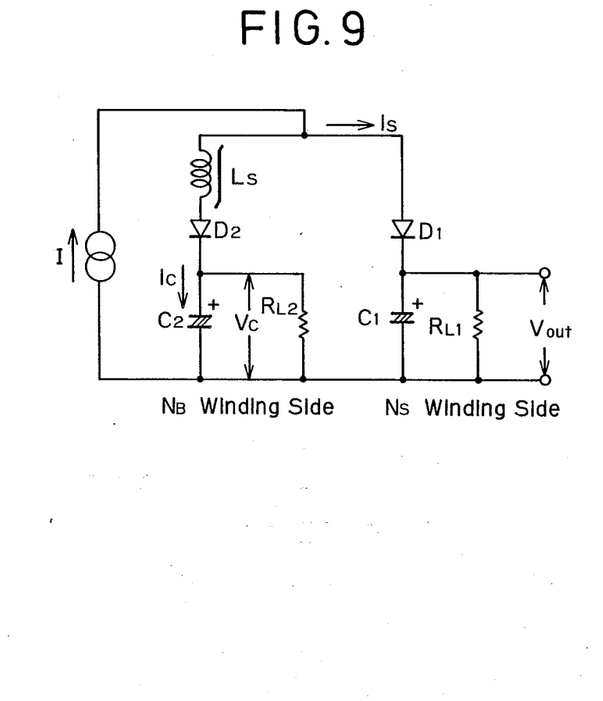
FIG. 9 is a diagram depicting an equivalent circuit when the switching element is in the OFF state.
Figure 10A:
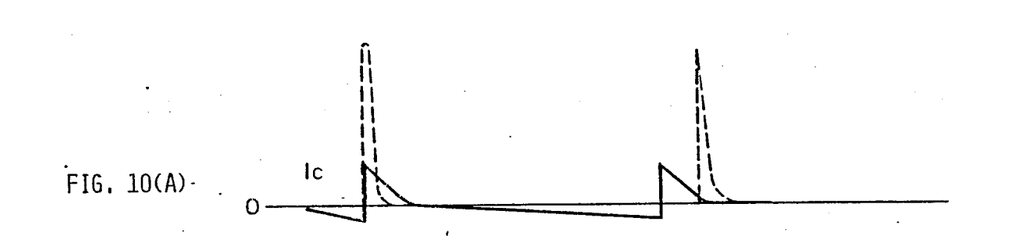
FIG. 10, comprising lines (A)-(D) is a diagram showing waveforms relative to the FIG. 8 embodiment.
Figure 10B:
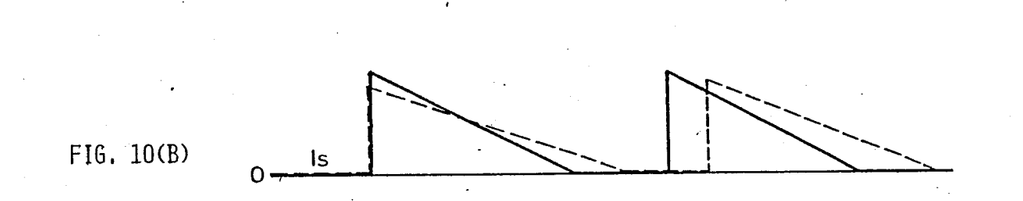
Figure 10C:
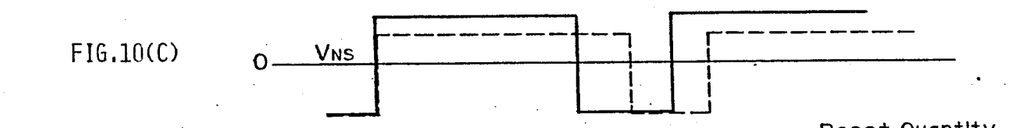
Figure 10D:
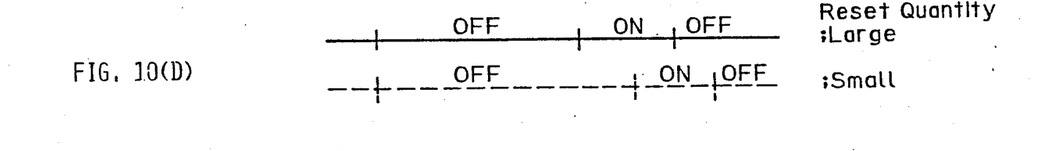

Operation of the embodiment of FIG. 8 is as follows with reference to FIG. 9 which depicts an equivalent circuit when the switching element Q is in the OFF state. The ringing choke converter power supply functions to accumulate the energy in the transformer while switching element Q is turned ON and to discharge the energy in secondary winding $N_s$ and voltage detection winding $N_B$ when element Q is in the OFF state. These steps are repeated.

It is to be noted that the placement of the circuit comprising saturable reactor $L_S$ of voltage detection winding $N_B$, feedback diode D2, and capacitor C2, is different from that in FIG. 5. This is because the sequence of arrangement is not of importance if the components are connected in series, and the symmetry with respect to the secondary winding is required to be enhanced for convenience of description.

FIG. 10 depicts waveforms associated with the embodiment of FIG. 8, wherein line (A) shows a current $i_c$ flowing in capacitor C2; line (B) shows a current $i_s$ flowing in the secondary winding; line (C) shows a voltage Vns generated in the secondary winding; and line (D) shows the ON/OFF states of switching element Q, wherein the solid line represents the state when the reset quantity is large, and the broken line indicates the state when the reset quantity is small.

When connecting the saturable reactor $L_s$ in series with voltage detection winding $N_B$, the amount of reset current $I_R$ flowing in control winding $L_C$, varies. As a result, the waveform of the current $i_c$ flowing into capacitor C2 changes. The error amplifier reduces the reset quantity when the output voltage Vout is high, but augments the resent quantity when the output voltage Vout is low.

Where the reset quantity is small, as shown by the broken line in line (D), the impedance of the secondary winding $N_s$ appears to be greater simultaneously when turning OFF the switching element Q, than in the case when there is a large reset quantity. Hence, the amount of current flowing in the voltage detection winding $N_B$ increases, and the peak value of the current $i_c$ is thereby incremented. The voltage Vc is given by the following equation (3).

$$Vc = \int^{T} i_c dt \cdot R_{L2}/T \qquad (3)$$

Similarly, voltage Vns is expressed by equation (4).

$$V_{ns} = L_{ns} \cdot (di_s/dt) \qquad (4)$$

Then, the peak value of the voltage Vns decreases, thereby reducing the output voltage Vout obtained by the peak rectifying of the voltage Vns.

As above discussed, when the output voltage rises, the reset quantity of the saturable reactor is reduced due to the error amplifier circuit. As a result, the feedback is effected in such a direction as to decrease the output voltage On the other hand, if the output voltage Vout drops, the reset quantity is augmented, and the feedback is effected in such a direction as to increase the output voltage Vout, thus stabilizing the output voltage Vout.

The invention exhibits the following advantageous effects.

1. Since the variable impedance element stabilizes the output on the secondary side, the following are improved: instability of the output voltage due to leakage inductance; and the forward voltage of the rectifier diode; and DC resistance component of the output circuit. Thus, stability which is about the same as that for direct feedback, is attained by the invention.

2. If the variable impedance element is, as in the first and second illustrative embodiments, disposed on the secondary side, the stabilizing of the output circuit can be effected on the secondary side alone. The primary side is substantially insulated from the secondary side, thereby enhancing the security.

3. When the variable impedance element is disposed on the primary side, as in the third illustrative embodiment, the primary side is substantially insulated from the secondary side, under control of the control winding $L_C$. The security is thus enhanced.

4. The operation of the saturable reactor exerts an influence on the control system so that an element having a small ET product, i.e., a small sized element, suffices This is different from a device using an element having a large ET product typically in a magnetic amplifier system which uses the saturable reactor. The magnetic amplifier system is used for controlling the output voltage by cutting the pulse width of the secondary voltage being rectified.

Although the illustrative embodiments of the invention have been described in detail with reference to the accompanying drawing, it is to be understood that the invention is not limited to those precise embodiments. Various changes or modifications may be effected therein by one skilled in the art without departing from the scope or spirit of the invention.

What is claimed is:

1. A ringing choke converter power supply device comprising
   a ringing choke converter power supply in which an output voltage is stabilized by an indirect feedback system;
   a saturable reactor provided on a primary or secondary side of said ringing choke converter power supply; and
   a control circuit for transmitting a control signal to said saturable reactor in such a direction that an error signal becomes zero by making a comparison between an output voltage of said ringing choke converter power supply and a predetermined reference voltage; wherein said ringing choke power supply comprises
   a transformer in which a DC input voltage is impressed on an anode of a primary winding thereof;
   a switching element having an input terminal to which a cathode of said primary winding is connected, and an output terminal to which a reference voltage line on an input side is connected;
   a secondary circuit for outputting a DC voltage by rectification smoothing a switching signal generated in a secondary winding of said transformer;
   a voltage detecting winding provided in said transformer;
   a current limit resistance interposed between said voltage detection winding and a control terminal of said switching element;
   a feedback diode having a cathode and connected to a connecting point between said voltage detection winding and said current limit resistance;
   a Zener diode having a cathode end thereof connected to a connecting point between said current limit resistance and said control terminal of said switching element; and
   a capacitor for connecting said reference voltage line to said connecting point between said feedback diode and said Zener diode.

2. The device of claim 1, wherein said saturable reactor element is interposed between said transformer secondary winding and a rectifier circuit.

3. The device of claim 1, wherein said saturable reactor element is interposed between said voltage detection winding and said feedback diode, or between said feedback diode and said capacitor.

4. The device of claim 3, wherein element a control winding is wound on the same core as that of said saturable reactor and is supplied with an output signal from said control circuit.

5. A ringing choke converter power supply device comprising
   a ringing choke converter power supply comprising a transformer in which a DC input voltage is impressed on an anode of a primary winding, a switching element in which a reference voltage line on the input side is connected to an output terminal, a first secondary circuit for outputting a DC voltage by rectification smoothing a switching signal generated in a first secondary winding of said transformer, a second secondary circuit for the DC voltage by rectification smoothing a switching signal generated in a second secondary winding of said transformer, a voltage detection winding provided in said transformer, a current limit resistance disposed between said voltage detection winding and a control terminal of said switching element, a feedback diode having a cathode terminal connected to a connecting point between said voltage detection winding and said current limit resistance, a Zener diode having a cathode terminal connected to a connecting point between said current limit resistance and said control terminal of said switching element, and a capacitor for connecting said reference voltage line to a connecting point between said feedback diode and said Zener diode;
   a saturable reactor provided on a primary or secondary side of said ringing choke converter power supply and having the same core winding with two windings;
   a signal processing circuit for performing an arithmetic operation with respect to output voltages of said first and second secondary circuits of said ringing choke converter power supply; and
   a control circuit for transmitting a control signal to said saturable reactor in such a direction that an error signal obtained by comparing a signal processed by said signal processing circuit with a predetermined reference voltage becomes zero.

6. The device of claim 5, wherein said arithmetic operation of said signal processing circuit takes the larger or smaller of the output voltages of said first and second secondary circuits.

* * * * *